US012469663B2

(12) United States Patent
Zeng et al.

(10) Patent No.: US 12,469,663 B2
(45) Date of Patent: Nov. 11, 2025

(54) QUASI-MACROSCOPIC COLD CATHODE FIELD EMISSION ELECTRON GUN AND MANUFACTURING METHOD THEREOF

(71) Applicant: Zhengzhou University of Aeronautics, Zhengzhou (CN)

(72) Inventors: Fanguang Zeng, Zhengzhou (CN); Yan Li, Zhengzhou (CN); Huali Ma, Zhengzhou (CN); Peng Yang, Zhengzhou (CN); Mingyu Li, Zhengzhou (CN); Yajuan Zheng, Zhengzhou (CN); Zhen Yan, Zhengzhou (CN); Ming Jiang, Zhengzhou (CN); Mengyuan Zhao, Zhengzhou (CN); Zihua Dong, Zhengzhou (CN); Qianqian Li, Zhengzhou (CN); Weichao Ma, Zhengzhou (CN); Zhaojun Tang, Zhengzhou (CN); Kun Xu, Zhengzhou (CN); Linjie Fu, Zhengzhou (CN)

(73) Assignee: Zhengzhou University of Aeronautics, Zhengzhou (CN)

( * ) Notice: Subject to any disclaimer, the term of this patent is extended or adjusted under 35 U.S.C. 154(b) by 403 days.

(21) Appl. No.: 17/974,603

(22) Filed: Oct. 27, 2022

(65) Prior Publication Data

US 2023/0133255 A1 May 4, 2023

(51) Int. Cl.

| | |
|---|---|
| ***H01J 9/02*** | (2006.01) |
| ***B22F 10/28*** | (2021.01) |
| ***B22F 12/41*** | (2021.01) |
| ***H01J 37/073*** | (2006.01) |

(52) U.S. Cl.

CPC .............. *H01J 9/025* (2013.01); *B22F 10/28* (2021.01); *B22F 12/41* (2021.01); *H01J 37/073* (2013.01)

(58) Field of Classification Search

CPC .. H01J 9/025; H01J 1/304; H01J 37/30; H01J 2237/061

See application file for complete search history.

(56) References Cited

U.S. PATENT DOCUMENTS

2001/0024082 A1 9/2001 Tomii
2009/0218508 A1 9/2009 Tamura et al.

FOREIGN PATENT DOCUMENTS

CN 110235217 A * 9/2019 ............ H01J 37/073
CN 114512378 A 5/2022

* cited by examiner

*Primary Examiner* — David E Smith

(57) ABSTRACT

A quasi-macroscopic cold field emission electron gun and a manufacturing method thereof are provided, which includes a filament device and an electron gun base, wherein the filament device includes a cold cathode filament and a conductive capillary tube, the cold cathode filament passes through one end of the conductive capillary tube and is crimped through a pressing groove device, the other end of the conductive capillary tube is connected to the electron gun base, and the end of the cold cathode filament is the electron emission end. Through the coaxial nesting and pressing deformation of quasi-macroscopic carbon fiber and metal tube and using of the non welding electrical connection method, this technology avoids the problem that it is not easy to form a reliable electrical connection during the welding process due to the poor wettability between carbon fiber and metal.

7 Claims, 5 Drawing Sheets

QUASI-MACROSCOPIC COLD CATHODE FIELD EMISSION ELECTRON GUN AND MANUFACTURING METHOD THEREOF

CROSS-REFERENCE TO RELATED APPLICATIONS

This application claims priority to Chinese Application No. 202111261624.5, filed on Oct. 28, 2021, entitled quasi-macroscopic cold cathode field emission electron gun and manufacturing method thereof. These contents are hereby incorporated by reference.

TECHNICAL FIELD

The disclosure relates to the manufacturing field of electron gun emitting devices, in particular to a quasi-macroscopic cold cathode field emission electron gun and manufacturing method thereof.

BACKGROUND

1. Mesoscopic scale component manufacturing is the bottleneck in the field of intelligent manufacturing of micro mechanical systems.

System miniaturization is the common pursuit of many fields, such as electronic communications, biomedicine, automation, optical systems and so on, which requires smaller and smaller parts. Therefore, people use various micro manufacture technologies to develop microcomponent products, such as micro actuators, micro mechanical devices, sensors and probes, microchannel, medical implants, optical components, and other micro electro mechanical system (MEMS) devices. However, how to manufacture complex metal microcomponents for these micro devices has become a bottleneck problem, and the size of some micro devices has increased significantly after packaging.

Micro manufacturing can be divided into MEMS process and non MEMS process. The former is based on lithography and the latter is based on mechanical processing, which are not competent for the manufacturing of metal microcomponents with complex shapes (especially small batch personalized manufacturing): The former has many difficulties, such as difficult to process complex 3D shapes, restrictions on material properties, complex processing equipment and processes, it is difficult to achieve real metal 3D micro manufacturing; The latter is difficult to process microcomponents with sub micron feature scale. Therefore, it is urgent to develop manufacturing methods suitable for 3D metal microcomponents with complex shapes.

2. mEBM is expected to solve the problem of mesoscopic scale component. The key lies in the appropriate filament materials and devices of electron gun Electron beam additive manufacturing (EBAM) based on electron beam melting (EBM) is a layer-by-layer increased full digital direct manufacturing method. By using focused energy beam to selectively melt the metal powder paved on the powder bed layer by layer, it can realize the manufacturing of arbitrary complex shapes, hollow structures and functionally gradient materials, effectively reduce the manufacturing cost and development cycle of parts. The material made by this method has excellent material properties, which can connect different materials, significantly reduce material waste, and save expensive tooling costs and so on. The existing EBM electron gun adopts tungsten filament hot cathode (Arcam S12, A2, A2x) or single crystal $LaB_6$ cathode (Arcam Q10, Q20). Wherein the focal spot size of tungsten filament is about 250 μm, the focal spot size of $LaB_6$ cathode is about 140 μm, they can only be used for the manufacture of macro mechanical parts. It can be seen that the existing EBAM technology is difficult to meet the manufacturing of mesoscopic scale components.

In addition, although the electron gun of the existing high-end electron microscope equipment has the electron beam focusing ability in nano scale, due to the lack of current extraction capacity, when the diameter of the converged electron beam is enlarged to the mesoscopic scale range, the power density decreases significantly, which can not meet the manufacturing demand of mEBM.

Therefore, to meet the manufacturing demand of mEBM, the electron gun requires to have both high emission current density and appropriate current extraction capacity, that is, to realize the optimization of emission current and current density. Among the electron guns widely used in electron microscopy, electron beam additive manufacturing, electron beam welding and other equipment, there are no electron gun components that can meet the application of mEBM, resulting in no mature direct manufacturing solutions and equipment for metal microcomponents in the market. The main reason for this problem lies in the lack of corresponding filament materials and devices.

3. quasi-macroscopic carbon fiber has the advantages of emission current and current density, which lays the material foundation for mEBM filament.

N. Behabtu et al. (Behabtu N, Pasquali M. Strong, light, multifunctionalfibers of carbon nanotubes with ultrahigh conductivity[J]. Science, 2013,339(6116):182-186.) prepared high-performance carbon nanotube fibers by wet spinning, and the field emission performance of a section sample with a diameter of 9 μm in the length of macro scale was tested. The test results show that under the field strength of t 0.86 V/μm, the emission current is 3.6 mA, and the current density can reach $5.8\times10^3$ A/$cm^2$, showing excellent electron emission performance. However, the geometric shape of carbon fibers formed by carbon nanotube spinning or chemical fiber carbonization and graphitization is inevitably irregular, and morphological defects caused by edge collapse are bound to form in the short cutting process, which seriously affects the symmetry of electron beam distribution, so it is not suitable for use as a single tip cold cathode.

Zeng fanguang et al. (Patent Publication No.: CN107119348A) used the method of vapor growth based on non-catalytic cracking of methane to prepare quasi-macroscopic carbon fibers with smooth hemispherical ends and axially symmetrical morphology, which are quasi ideal. The field emission performance of a 5 mm length fiber with a diameter of 18 μm was tested, the test result shown that the emission current reaches 1.3 mA, and the current density reaches 1.5 kA/$cm^2$ when the macro field strength is 1.36V/μm, which also shows excellent electron emission performance. Due to the different test structure, the electron emission properties of carbon nanotube fibers of N.Behabtu et al can not be directly compared, but they are all of the same magnitude, and the emission properties are extremely excellent.

From the perspective of comprehensive performance, the quasi-macroscopic carbon fiber prepared by Zeng fanguang et al. takes into account the perfect morphology, ideal geometric size and excellent electron emission characteristics, so that it can provide electron beams with higher symmetry, better uniformity, large current extraction capacity and high emission current density in the application of electron guns, which lays the foundation for the design of high-performance mEBM electron guns.

4. The premise of quasi-macroscopic carbon fiber practicality is to become a standardized filament device.

Although quasi-macroscopic carbon fiber has the advantages of micron diameter, centimeter length, perfect geometric state, large current extraction capacity and high emission current density, it must become a standardized and easily replaceable device to realize commercial mEBM application as a filament.

However, there are still the following technical problems in the existing technology. For the additive manufacturing of metal microcomponents with complex shape at mesoscopic scale, the diameter of the electron beam spot must match the characteristic scale of the manufacturing, so mEBMmust use micron or even smaller metal powder, and the required electron beam spot diameter also needs to be controlled within the scale range of micron to submicron or even deep submicron depending on the characteristic size, besides, the power density requires to reach the level of more than $10^5$ W/cm$^2$ (refer to the power density requirements of existing EBAM Technology). For this requirement, both the existing EBAM electron gun and electron gun of electron microscope are difficult to meet. The filament of the former electron gun (such as tungsten filament or $LaB_6$ single crystal) has strong current extraction capacity, but its emission surface is large (sub millimeter level), so it can not directly produce micron or even smaller focused electron beam, which makes it impossible to realize micro manufacturing. Although the filament of the latter electron gun (such as tungsten single crystal) has good electron emission ability (the current density can reach the order of kA/cm$^2$), the diameter of the emission surface in this mode is only in the nm scale, and the current extraction capacity is not enough, so it can only provide a total emission current of a few tens μA. When a beam of this magnitude is focused into a mesoscopic beam spot, the current density will decrease by several orders of magnitude, resulting in insufficient power density on mesoscopic scale, unable to realize metal melting, and expensive, which is not suitable for use as a mEBM filament with large consumption.

To sum up, the main technical problem of EBAM electron gun and electron gun of electron microscope is that the emission current, the current density and the beam quality are difficult to be well unified in one device, that is, the emission current density of the device with large emission current is generally small, while the device with large current density are difficult to provide large emission current. They both have certain weaknesses when it comes to the optimization of the current extraction and current density that needs to be achieved. For mEBM, the current extraction capacity determines the power, and the current emission density determines the power density. Both of them are the guarantee to achieve rapid and efficient metal micro melting.

SUMMARY

The disclosure improves the problem that the quasi-macroscopic cold cathode field emission material in the prior art has to be instrumented, and provides a quasi-macroscopic cold cathode field emission electron gun with good use effect and convenient replacement and a manufacturing method thereof.

A quasi-macroscopic cold cathode field emission electron gun is provided by the present disclosure, including a filament device and an electron gun base, wherein the filament device includes a cold cathode filament and a conductive capillary tube, the cold cathode filament passes through one end of the conductive capillary tube and then is crimped by a pressing groove device, the other end of the conductive capillary tube is connected to the electron gun base, and the end of the cold cathode filament is an electron emitting end;

wherein, the groove pressing device comprises two clamping arms which are in contact at opposite position, contact surfaces of one end of the two clamping arms are flat or wavy curved surfaces that coincide with each other, and the other end of the two clamping arms is a free end hinged to each other in the middle or a free end integrally connected to each other;

a size of the cold cathode filament is on a quasi macro scale, the quasi macro scale refers to that at least one dimension has macro characteristics and at least one dimension has micro characteristics, wherein a macro length dimension of the cold cathode filament is more than $10^0$ millimeters, and a micro diameter dimension of the cold cathode filament is within $10^0$-$10^2$ microns.

The material of cold cathode filament includes quasi macro carbon fiber, carbon nanotube bundle, lanthanum hexaboride, cerium hexaboride or tungsten single crystal, wherein an end of quasi macro carbon fiber is hemispherical, an end of carbon nanotube bundle is neat end, and an end of lanthanum hexaboride, cerium hexaboride or single crystal tungsten is tip end.

Preferably, the conductive capillary tube is inserted or snapped on the electron gun base.

A method for manufacturing the quasi-macroscopic cold cathode field emission electron gun mentioned above, includes the steps as follows:

step 1, selecting the conductive capillary with an inner diameter range of 1-15 times the diameter of quasi macro carbon fibers, wherein the conductive capillary is made of conductive metal materials;

step 1, selecting the conductive capillary with small diameter, thin wall and soft quality;

step 2, cutting the conductive capillary tube, by using of a tube cutter to cut the conductive capillary tube into small segments with appropriate length, and polishing them to ensure that a cut of the conductive capillary tube is regular and round, and the cut of the conductive capillary tube is smooth and free of burrs;

step 3, cleaning of the capillary copper tube, firstly, putting the copper capillary tube into a proper amount of a mixed solution of anhydrous alcohol and acetone for ultrasonic cleaning for 10-30 minutes, wherein a ratio of anhydrous alcohol and acetone is 1:1; taking the copper capillary tube out and then conducting ultrasonic cleaning in deionized water for 5-15 minutes, then taking out and putting the copper capillary tube into dilute hydrochloric acid for pickling for 3-5 minutes, after that washing the copper capillary tube with deionized water, and then taking out, and finally drying the treated copper capillary tube.

step 4, selecting a single quasi-macroscopic carbon fiber, observing a shape and size of the single quasi-macroscopic carbon fiber under a microscope, and storing the single quasi-macroscopic carbon fiber with appropriate size and ideal shape for the next step after removing the quasi-macroscopic carbon fiber with defects, wherein the ideal shape means that the quasi-macroscopic carbon fiber with a straight fiber body, a smooth surface, and a hemispherical top end, and the appropriate size refers to that a ratio of the length-diameter of the quasi-macroscopic carbon fiber conform to the manufacturing characteristics;

step 5, preliminary inserting and fixing the quasi-macroscopic carbon fiber filament, placing the quasi-macroscopic carbon fiber and the capillary copper tube obtained in the previous steps on a high-precision three-dimensional micro operation platform, and using tools to insert the quasi-macroscopic carbon fiber filament into the capillary copper tube, first, installing a micro clamping probe in a micro nano operation system on the high-precision three-dimensional micro operation platform composed of a linear platform driven by a piezoelectric motor, fixing the capillary copper tube on a base of the high-precision three-dimensional micro operation platform; secondly, clamping the quasi-macroscopic carbon fiber obtained in the previous steps in the micro clamping probe; setting the step displacement of rocker in the manual control mode, operating the rocker to perform a three-axis displacement operation on the micro clamping probe and the high-precision three-dimensional micro operation platform, so as to accurately control the clamp device to make the quasi-macroscopic carbon fiber accurately inserted into the capillary copper tube.

step 6: finalizing the shape of the quasi macro carbon fiber filament device, applying pressure to a predetermined position of the capillary copper tube which the quasi-macroscopic carbon fiber filament material has inserted into to make it deform, so as to fix the quasi-macroscopic carbon fiber and ensure a reliable electrical connection between the quasi-macroscopic carbon fiber and the capillary copper tube; for a thin neck crimping with a circular neck, a tail end of the conductive capillary tube is fixed on a rotating device, and the conductive capillary tube is rotated at the same time during the crimping process;

when the "bending" deformation operation is used, the conductive capillary tube does not need to rotate, and only the conductive capillary tube inserted with the quasi-macroscopic carbon fiber filament material is subjected to wave like "bending" deformation operation; an elastic contact between the two can be formed by a plastic deformation of the conductive capillary tube and an elastic of the quasi macro carbon fiber to ensure the reliable electrical connection.

Preferably, the conductive capillary tube is made of copper, aluminum, iron, gold, silver or nickel.

Compared with the prior art, the quasi-macroscopic cold field emission electron gun and its manufacturing method of the disclosure have the following advantages: the disclosure relates to a quasi-macroscopic scale carbon fiber filament material with high emission current density and good current extraction capacity, which is oriented to the additive manufacturing application of metal microcomponents with complex shapes, and takes into account the emission current and emission current density as a whole. The device structure and manufacturing technology to make this filament material become a standardized device, which provides a solution of standardized filament and designs the corresponding filament device. On this basis, it is very possible to develop electron gun devices for mEBM applications, so as to break through the bottleneck of AM technology for small and complex metal parts.

1. Based on the simple structure and manufacturing method, a high-performance, producibility and easy-to-use cold cathode field emission electron gun standardized filament device is obtained.

First of all, as for the filament material of the cold cathode field emission electron gun, the quasi-macroscopic carbon fiber filament material prepared by the non-catalytic high-temperature cracking method selected by the present disclosure has a hemispherical top end, large emission current density and current extraction capacity, which can ensure the generation of mesoscopic high-performance electron beams with sufficient current and high coherence in a not too small emission surface.

Secondly, in terms of fixing the quasi-macroscopic carbon fiber filament material, the present disclosure selects a metal tube with good conductivity, plasticity and other characteristics as a component for fixing the quasi-macroscopic carbon fiber filament material.

Finally, through the coaxial nested structure of quasi-macroscopic carbon fiber and metal tube and the manufacturing method of "pressing" and "bending" deformation operations, the present disclosure makes an elastic contact between the two and ensures reliable electrical connection. Through the metal tube in macro scale, the high electron emission performance advantage of quasi-macroscopic carbon fibers is brought out in the form of a productized and easy-to-operate cold cathode field emission electron gun standardized filament device, and the transformation from filament material to filament device is realized.

2. The quasi-macroscopic cold cathode electron gun filament device adopts the non welding electrical connection mode, which avoids the problem that it is not easy to form a reliable electrical connection during welding due to the poor wettability between carbon fiber and metal, and also avoids the damage and pollution of solder to the filament during high-temperature welding.

3. Based on the filament device of the present disclosure, an electron beam additive micro manufacturing method and equipment for complex shape metal microcomponents can be developed, injecting new vitality into high-end manufacturing and high-end equipment.

The present disclosure originates from and solves the needs. Starting from the key factors that restrict EBM to realize the additive manufacturing of small and complex metal parts, to figure out the material demand, such that the solution is deduced from the existing quasi one-dimensional carbon material characteristics, and the cold cathode field emission electron gun filament device is designed and manufactured based on the quasi one-dimensional quasi-macroscopic carbon fiber material. It can not only be applied in mEBM, but also fill the blank in the manufacturing field of metal microcomponents with complex shapes at mesoscale, opening up a new way for system miniaturization parts and components. Moreover, it can promote other fields such as electron beam welding, electron beam exposure and electron microscope.

Figure 1:
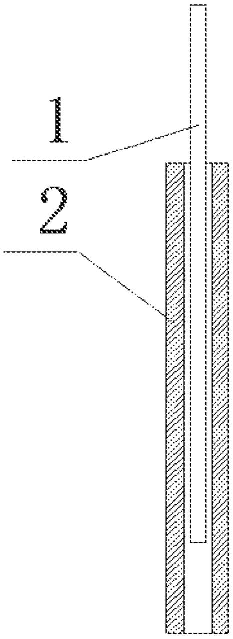
FIG. 1 is a structural diagram of a quasi-macroscopic carbon fiber filament and a conductive capillary tube in the present disclosure.
Figure 2:
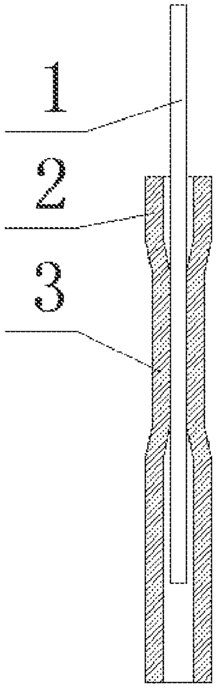
FIG. 2 is a schematic diagram of the sectional structure of the quasi-macroscopic carbon fiber filament and the conductive capillary tube in the disclosure through the plane pressing groove.
Figure 3:
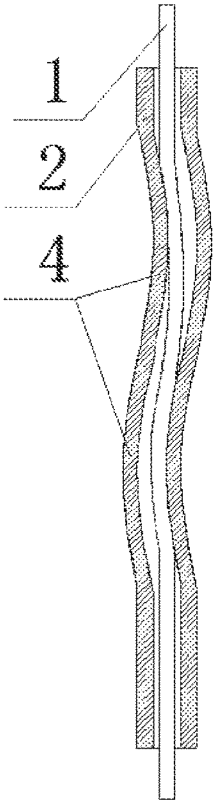
FIG. 3 is a schematic diagram of the sectional structure of the quasi-macroscopic carbon fiber filament and the conductive capillary tube passing through an arc-shaped pressing groove in the present disclosure.
Figure 4:
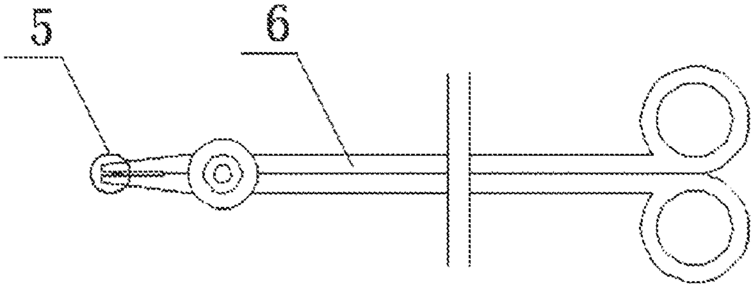
FIG. 4 is the first structural diagram of the medium pressure tank device of the disclosure.
Figure 5:
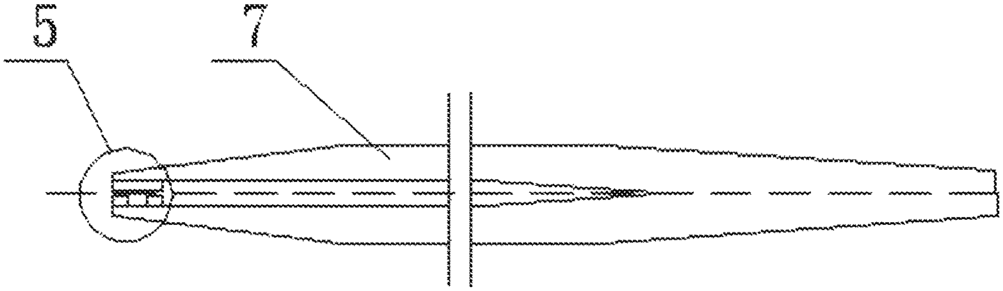
FIG. 5 is the second structural diagram of the medium pressure tank device of the disclosure.
Figure 6:
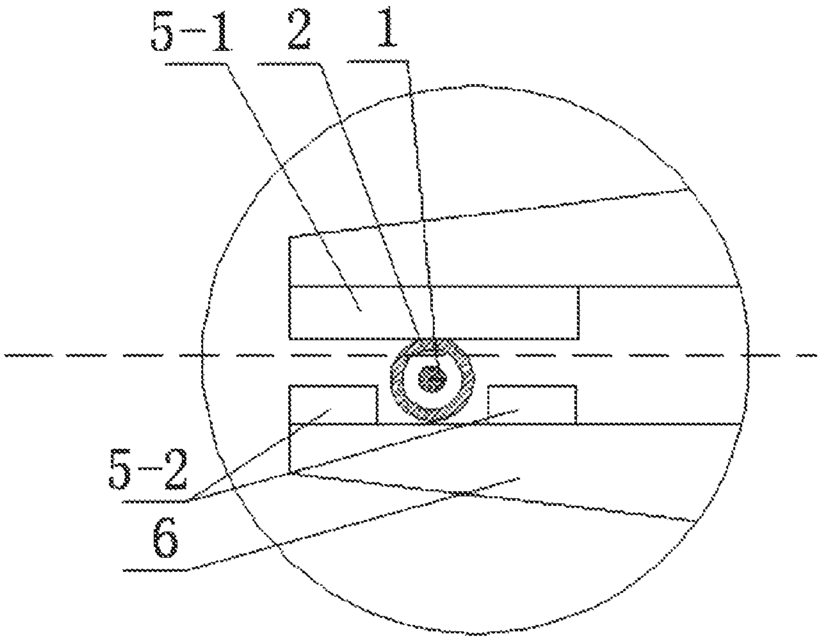
FIG. 6 is the first enlarged structural diagram of the clamping part in the present disclosure.
Figure 7:
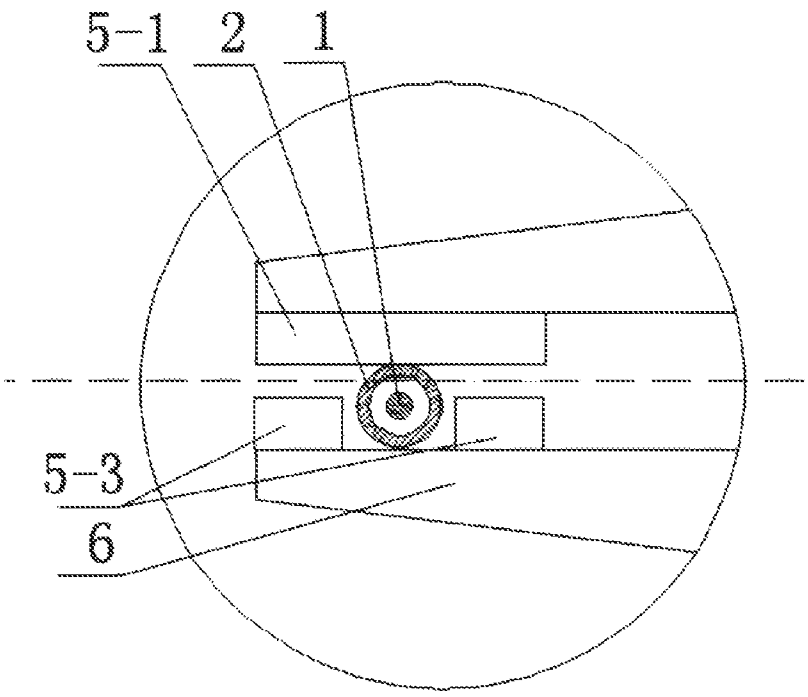
FIG. 7 is the second enlarged structural diagram of the clamping part in the present disclosure.
Figure 8:
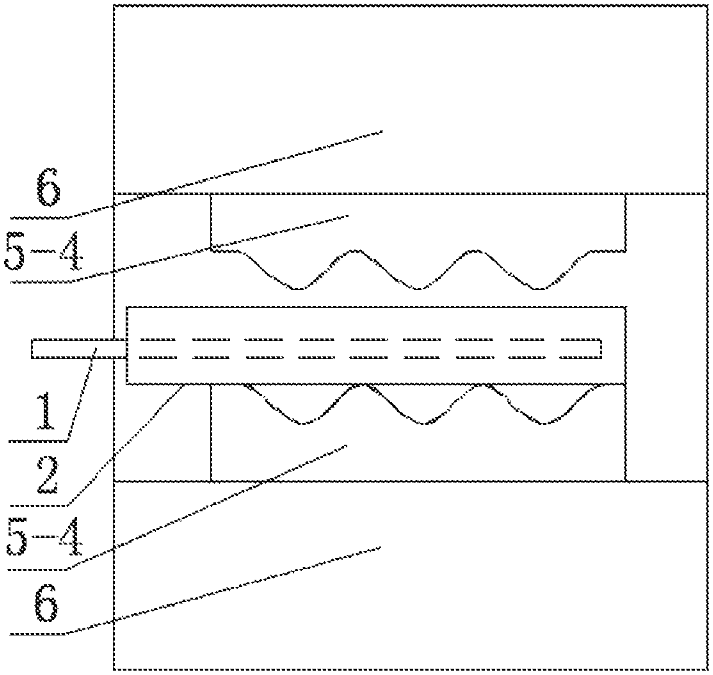
FIG. 8 is the third enlarged structural diagram of the clamping part in the present disclosure.
Figure 9:
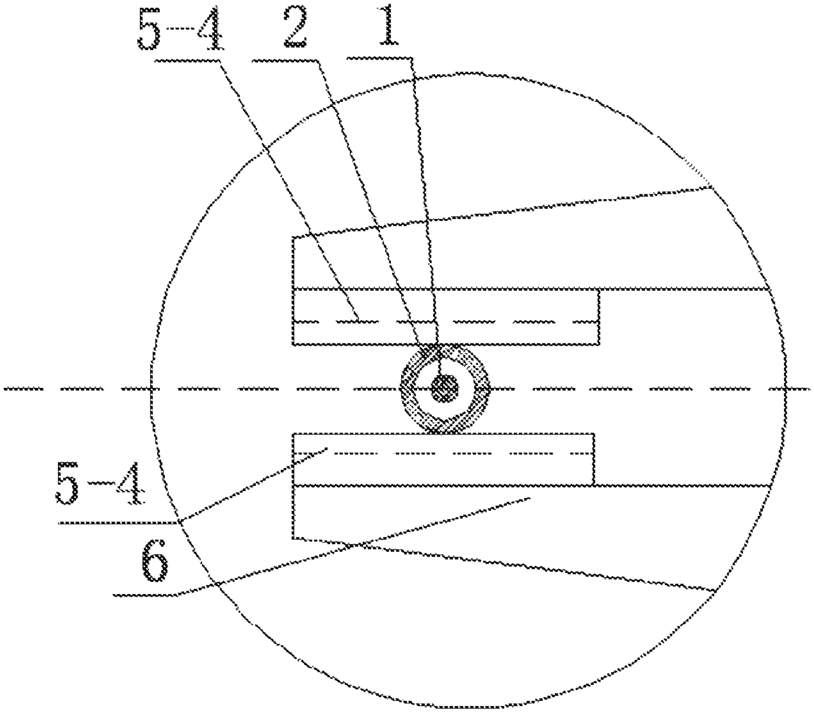
FIG. 9 is the left side view showing the structure of FIG. 8 in the present disclosure.

In reference labels in the attached drawings: 1: quasi-macroscopic carbon fiber filament; 2: conductive capillary tube; 3: plane pressing groove; 4: arc-shaped pressing groove; 5: pressing groove device; 5-1: upper pressing block; 5-2: flat lower pressing block; 5-3: thin neck lower pressing block; 5-4: curved pressing block; 6: scissors type clamping arm; 7: tweezers type clamping arm.

DETAILED DESCRIPTION OF THE EMBODIMENTS

The quasi-macroscopic cold cathode field emission electron gun and its manufacturing method of the present disclosure will be further described below in combination with the drawings and specific embodiments: in order to facilitate understanding of the present technology, several technical terms involved in the present application will be introduced first.

Quasi-macroscopic carbon fiber refers to the carbon fiber with macro characteristics in some dimensions and micro characteristics in other dimensions, such as the carbon fiber with a length of more than millimeter and a diameter of less than several tens of microns.

Vapor growth refers to the growth process based on the high-temperature cracking of methane or other carbon containing gases. The gas phase grown carbon fiber is different from the carbon fiber based on the chemical fiber carbonization.

Complex shape metal microcomponents refer to micro metal parts with feature sizes between macro and micro (sub-millimeter to sub-micron, also known as mesoscopic scale in the present disclosure) and three-dimensional complex structures (even spatial grids or hollow structures). This scale range is too small for conventional machining, but too large for micro machining technology based on lithography. Moreover, the complex spatial structure makes it impossible to directly manufacture by conventional means, which is a manufacturing bottleneck in micro systems, micro robots and other fields.

Electron beam additive micro manufacturing or electron beam additive manufacturing (mEBM) uses electron beam melting (EBM) as the basic method of additive manufacturing, and the additive manufacturing of micro metal parts with complex shapes can be realized by reducing the size of electron beam spots and metal powder particles to be melted.

As shown in FIG. 1 to FIG. 9, this embodiment provides a standardized quasi-macroscopic carbon fiber filament structure and devices.

The structure of the filament device can be roughly summarized into two parts, one is the emitter, that is, the filament material, such as the quasi macro carbon fiber or other similar materials mentioned in the invention; the other is the support body, which is used for clamping and fixing the electron gun device, namely the capillary part of the invention.

The selected quasi-macroscopic carbon fiber filament material is on macro scale in length dimension and micro scale in diameter dimension, which is visible to the naked eye and convenient for single picking and manipulation. The selected metal tube is soft with good electrical conductivity and strong mechanical damage resistance, which is convenient for deformation operation in device structure design. Through structured design, the high-performance quasi-macroscopic carbon fiber filament material and the metal tube with excellent physical properties are perfectly combined to form a standardized and easy to operate filament device.

In order to achieve the above objectives, the basic idea of the present disclosure is that the high-performance quasi-macroscopic carbon fiber material is used as the cold cathode field emission filament, the metal tube is used as a clamping component to the quasi-macroscopic carbon fiber filament. The effect of crimping is achieved by applying appropriate pressure to the metal tube penetrating the quasi-macroscopic carbon fiber to generate deformation, so as to ensure the reliability of the electrical connection between the quasi-macroscopic carbon fiber and the metal tube. So that the quasi-macroscopic carbon fiber becomes a standardized and operable filament device. The main steps include material preparation, cleaning, assembly, crimping, and etc.

A manufacturing method of the quasi-macroscopic carbon fiber cold cathode field emission filament device is provided and the manufacturing steps are as follows, taking a capillary copper tube as an example, but not limited to the capillary copper tube:

Step 1, Selection of capillary copper tube: selecting capillary copper tube with small diameter, thin wall and soft quality. Specifically, the capillary copper tubes made of conductive metal materials with an inner diameter range of 1-15 times the diameter of quasi macro carbon fibers are selected;

Step 2, Cutting of capillary copper tube: applying a tube cutter to cut the capillary copper tube into small sections with appropriate length and conduct further treatment to ensure that the cut is regular and round, and the cut is smooth and free of burrs.

In this embodiment, the tube cutter whose tube diameter cutting range can cover the conductive capillary tube to be used in the invention can be used. And the "appropriate length" means that the following requirements are met: (1) it is convenient to install and fix on the filament holder of the electron gun assembly; (2) the part exposed to the electric field on the filament holder will not affect the electron emission behavior of the filament. According to this, the total length of the capillary tube can be divided into the part that is required to be clamped by the filament holder and not affected by the electric field and the part exposed to the electric field. The length of the part used for clamping and not affected by the electric field can be 3-15 mm, and the length of the part exposed to the electric field can be 0-3 mm. The specific value can be determined by simulation data and/or experimental debugging in combination with the overall design of the system.

Step 3, Cleaning of capillary copper tubes: cleaning the capillary copper tubes cut into small sections according to standard cleaning procedures and then dry them for use. The cleaning procedure is as follows: firstly, the copper capillary tube is put into a proper amount of mixed solution containing anhydrous alcohol and acetone with a ratio 1:1 for ultrasonic cleaning for 10-30 minutes, the copper capillary tube is taken out and then conducted ultrasonic cleaning in deionized water for 5-15 minutes, then the copper capillary tube is taken out and put into dilute hydrochloric acid for pickling for 3-5 minutes to remove the oxide layer on the copper surface, after that, the copper capillary tube is washed with deionized water and then taken out, and finally the treated copper capillary tube is dried or blow dried with high-purity gas.

Step 4, Selection of quasi-macroscopic carbon fiber filament material: selecting a single quasi-macroscopic carbon fiber, observing the shape and size under the microscope, and storing the single quasi-macroscopic carbon fiber with appropriate size and ideal shape for the next step after removing the defective quasi-macroscopic carbon fiber. The ideal shape mentioned here means that the fiber is straight, the surface is smooth, and the top is hemispherical. The appropriate size refers to that the diameter and the ratio of the length-diameter of quasi-macroscopic carbon fiber conform to the filament emission surface diameter obtained according to the manufacturing feature size and the electronic optical principle.

Step 5, Preliminary insertion and fixation of quasi-macroscopic carbon fiber filament materials: properly placing the quasi-macroscopic carbon fiber and the capillary copper tube obtained in the previous steps, and using appropriate tools, such as magnifying glass, microscope, tweezers, manipulator, translation table, etc., to insertion the quasi-macroscopic carbon fiber filament into the capillary copper tube.

Figure 10:
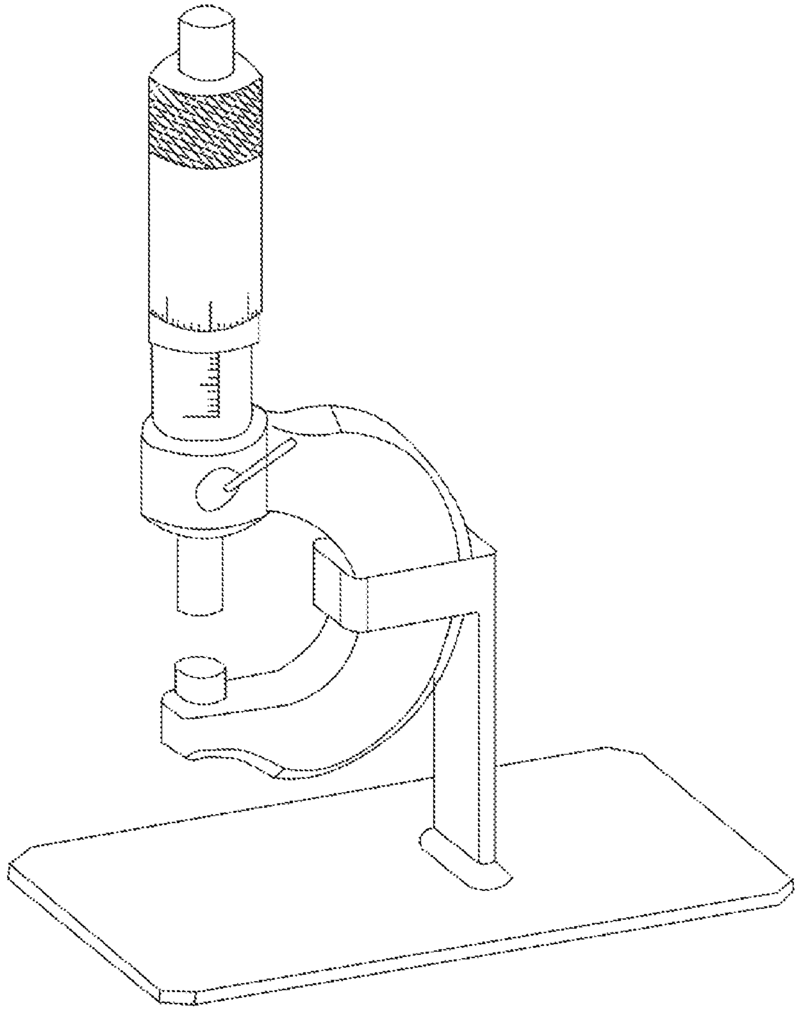
FIG. 10 is a structural diagram of self built crimping device for crimping process.

The insertion process can be completed manually with the naked eye and auxiliary tools. As shown in FIG. 10, the device is a self built crimping device. The crimping deformation generated by the capillary tube in the crimping process can be controlled by using the precision measurement principle of the screw micrometer to ensure that good electrical contact performance can be achieved without crushing the filament material due to excessive crimping. If the crimping is wave type, only needs to change the shape of the crimping surface.

Or, the insertion process can also be completed with the help of the nanomechanical manipulation system produced by Femtotools. The system produced by Femtotools manipulates the mechanical arm and micro pliers through the control system, thus realizing various micro manipulation and micro assembly functions. The nanomechanical manipulation system produced by Femtotools is known by the skilled person in the art, so there is not described details for brevity.

The specific insertion steps are as follows: First, the micro clamping probe in the micro nano operation system is installed on the high-precision three-dimensional micro operation platform composed of a linear platform driven by a piezoelectric motor, and the capillary copper tube is fixed on the base of the operation platform. Secondly, the quasi-macroscopic carbon fiber obtained in the above steps is clamped in the micro clamping probe. In the manual control mode, the step displacement of rocker is set, and the rocker is operated to perform the three-axis displacement operation on the micro clamping probe and the platform. The details of the quasi-macroscopic carbon fiber insertion operation of the capillary copper tube can be observed in the external display screen of the supporting optical microscope, and the clamp device can be accurately controlled to make the quasi-macroscopic carbon fiber accurately inserted into the capillary copper tube.

Step 6, Finalizing the shape of quasi-macroscopic carbon fiber filament devices: there are two methods can be used: "pressing" deformation (see FIG. 2) or "bending" deformation (see FIG. 3). The first one is the "pressing" deformation operation, which is divided into flat pressing and thin neck pressing. The clamping degree of the flat pressing on the capillary copper tube is less than that of the thin neck pressing. During the thin neck pressing, the capillary copper tube is rotated and pressed for many times (see FIG. 6 and FIG. 7). Applying pressure to the predetermined position of the capillary copper tube which the quasi-macroscopic carbon fiber filament material has inserted into to make it deform, so that the quasi-macroscopic carbon fiber plays a fixed role and ensures the reliable electrical connection between the quasi-macroscopic carbon fiber and the capillary copper tube.

The second one is "bending" deformation operation (see FIG. 8 and FIG. 9): the capillary copper tube inserted with quasi-macroscopic carbon fiber filament material is subjected to wave like "bending" deformation operation through curved pressing block. This method relies on the plastic deformation of the capillary copper tube and the elastic retention of the quasi-macroscopic carbon fiber itself to form an elastic contact between the two and ensure reliable electrical connection.

The key improvement points of the disclosure are as follows:

1. High performance focused electron beams at mesoscopic scale are realized by quasi one dimensional quasi-macroscopic filament materials.

At present, although the hot cathode represented by tungsten filament and the Schottky cathode represented by $LaB_6$ single crystal have strong current extraction capacity, the emitting surface is on the sub-millimeter scale, which is impossible to realize the mesoscopic focused ion beam. Although the cold cathode represented by tungsten single crystal has high current density, the diameter of the emission surface is only on the nanometer scale, when focused into the electron beam of mesoscopic scale, the power density of the electron beam on the mesoscopic scale will drop by several orders of magnitude, and the metal cannot be melted.

The above electron gun filament materials can not achieve the optimization of current extraction capacity and current density, and thus can not obtain high-performance focused electron beams on the mesoscopic scale. However, the quasi one-dimensional quasi-macroscopic carbon fiber filament material selected by the present disclosure has excellent shape (linear shape, hemispherical top), scale (length of more than 100 mm, diameter of 100-101 μm) and electron emission capability (mA level current extraction capacity of a single fiber and $kA/cm^2$ level emission current density) can realize the optimization of current extraction capacity and current density, thus obtaining high-performance focused electron beams on the mesoscopic scale.

2. Using the coaxial nested structure of metal tube and quasi-macroscopic carbon fiber and the plastic-elastic docking mechanism in the crimping process, the standardized, easy to operate and easy to replace filament devices are realized.

If the quasi-macroscopic carbon fiber can become an operable device, its quasi perfect scale and electron emission advantages can be better displayed. The present disclosure combines the plastic property of the metal tube with the elastic property of the quasi-macroscopic carbon fiber, through coaxial nested structure and applying appropriate pressure and deformation operation, the elastic contact between the metal tube and the quasi-macroscopic carbon fiber is formed by the plastic deformation of the metal tube and the elastic retention of the quasi-macroscopic carbon fiber itself, so as to ensure reliable electrical connection, thereby obtaining a standardized, easy to operate and easy to replace quasi-macroscopic carbon fiber filament device.

After the tail end of the quasi-macroscopic carbon fiber is inserted into the conductive capillary tube, the two can form a good conductive contact through non welding crimping, which avoids the problems of false welding caused by the non wetting of carbon and metal. The top of the quasi-macroscopic carbon fiber is the electron emission end, which usually has regular geometry such as hemispherical shape to ensure the regularity and uniformity of the electron emission beam spot.

The quasi-macroscopic carbon fiber with this shape can also be grown by the catalytic method. Therefore, in addition to the quasi-macroscopic carbon fiber filament material prepared by the non catalytic method, the quasi-macroscopic carbon fiber prepared by the catalytic method can also be used as the filament material for standardized filament devices.

If $LaB_6$ single crystal and other materials with electron emission ability (such as cerium hexaboride and tungsten single crystal) are used to make such quasi-macroscopic fibers, the method provided by the present disclosure can also be used to make standardized filament devices.

The metal tube for inserting and fixing the quasi-macroscopic carbon fiber mentioned in the present disclosure is not limited to the capillary copper tube, and the metal tube with conductivity and other solid conductive materials can also take into account.

In addition, if there is no high requirement on the top shape, single root and symmetry of electron beam spot distribution of the filament material, the carbon nanotube bundle and the carbon fiber bundle reported in other existing documents can also be used as the filament material, and the filament structure and implementation method of the present disclosure can be used to produce a standardized filament device.

3. The special pressing tool can press the conductive capillary according to the predetermined pressing degree, and finally realize the standardized and reliable connection effect.

What is claimed is:

1. A quasi-macroscopic cold cathode field emission electron gun, comprising a filament device and an electron gun base, wherein the filament device comprises a cold cathode filament and a conductive capillary tube, the cold cathode filament passes through one end of the conductive capillary tube and then is crimped by a pressing groove device, the other end of the conductive capillary tube is connected to the electron gun base, and the end of the cold cathode filament is an electron emitting end;

the pressing groove device comprises two clamping arms;

a size of the cold cathode filament is on a quasi macro scale, defined such that a length dimension of the cold cathode filament is more than $10^0$ millimeters, and a diameter dimension of the cold cathode filament is between $10^0$-$10^2$ microns.

2. The quasi-macroscopic cold cathode field emission electron gun according to claim 1, wherein the conductive capillary tube is configured to be inserted into the electron gun base.

3. The quasi-macroscopic cold cathode field emission electron gun according to claim 1, wherein the material of cold cathode filament comprises quasi macro carbon fiber, carbon nanotube bundle, lanthanum hexaboride, cerium hexaboride or tungsten single crystal, wherein an end of quasi macro carbon fiber is hemispherical, an end of carbon nanotube bundle is neat end, and an end of lanthanum hexaboride, cerium hexaboride or tungsten single crystal is tip end.

4. A method for manufacturing the quasi-macroscopic cold cathode field emission electron gun according to claim 1, wherein the method comprises the steps as follows:

step 1, selecting the conductive capillary with an inner diameter range of 1-15 times the diameter of quasi macro carbon fibers, wherein the conductive capillary is made of conductive metal materials;

step 2, cutting the conductive capillary tube, by using of a tube cutter to cut the conductive capillary tube into small segments with appropriate length, and polishing them to ensure that a cut of the conductive capillary tube is regular and round, and the cut of the conductive capillary tube is smooth and free of burrs;

step 3, cleaning of the capillary copper tube, firstly, putting the copper capillary tube into a proper amount of a mixed solution of anhydrous alcohol and acetone for ultrasonic cleaning for 10-30 minutes, wherein a ratio of anhydrous alcohol and acetone is 1:1; taking the copper capillary tube out and then conducting ultrasonic cleaning in deionized water for 5-15 minutes, then taking out and putting the copper capillary tube into dilute hydrochloric acid for pickling for 3-5 minutes, after that washing the copper capillary tube with deionized water, and then taking out, and finally drying the treated copper capillary tube;

step 4, selecting a single quasi-macroscopic carbon fiber, observing a shape and size of the single quasi-macroscopic carbon fiber under a microscope, and storing the single quasi-macroscopic carbon fiber with appropriate size and ideal shape for the next step after removing the quasi-macroscopic carbon fiber with defects, wherein the ideal shape means that the quasi-macroscopic carbon fiber with a straight fiber body, a smooth surface, and a hemispherical top end, and the appropriate size refers to that a ratio of the length-diameter of the quasi-macroscopic carbon fiber conform to the manufacturing characteristics;

step 5, preliminary inserting and fixing the quasi-macroscopic carbon fiber filament;

step 6: finalizing the shape of the quasi macro carbon fiber filament device.

5. The method for manufacturing the quasi-macroscopic cold cathode field emission electron gun according to claim 4, wherein the step 5 of preliminary inserting and fixing the quasi-macroscopic carbon fiber filament comprises placing the quasi-macroscopic carbon fiber and the capillary copper tube obtained in the previous steps on a high-precision three-dimensional micro operation platform, and using tools to insert the quasi-macroscopic carbon fiber filament into the capillary copper tube, first, installing a micro clamping probe in a micro nano operation system on the high-precision three-dimensional micro operation platform composed of a linear platform driven by a piezoelectric motor, fixing the capillary copper tube on a base of the high-precision three-dimensional micro operation platform; secondly, clamping the quasi-macroscopic carbon fiber obtained in the previous steps in the micro clamping probe; setting the step displacement of rocker in the manual control mode, operating the rocker to perform a three-axis displacement operation on the micro clamping probe and the high-precision three-dimensional micro operation platform, so as to accurately control the clamp device to make the quasi-macroscopic carbon fiber accurately inserted into the capillary copper tube.

6. The method for manufacturing the quasi-macroscopic cold cathode field emission electron gun according to claim 4, wherein the step 6 of finalizing the shape of the quasi macro carbon fiber filament device comprises applying pressure to a predetermined position of the capillary copper tube which the quasi-macroscopic carbon fiber filament material has inserted into to make it deform, so as to fix the quasi-macroscopic carbon fiber and ensure a reliable electrical connection between the quasi-macroscopic carbon fiber and the capillary copper tube; for a thin neck crimping with a circular neck, a tail end of the conductive capillary tube is fixed on a rotating device, and the conductive capillary tube is rotated at the same time during the crimping process;

when the “bending” deformation operation is used, the conductive capillary tube does not need to rotate, and only the conductive capillary tube inserted with the quasi-macroscopic carbon fiber filament material is subjected to wave like “bending” deformation operation; an elastic contact between the two can be formed by a plastic deformation of the conductive capillary tube and an elastic of the quasi macro carbon fiber to ensure the reliable electrical connection.

7. The method for manufacturing the quasi-macroscopic cold cathode field emission electron gun according to claim 4, wherein the conductive capillary tube is made of copper, aluminum, iron, gold, silver or nickel.

* * * * *